US010985292B2

(12) United States Patent
Höppel (10) Patent No.: US 10,985,292 B2
(45) Date of Patent: Apr. 20, 2021

(54) METHOD FOR TRANSFERRING SEMICONDUCTOR BODIES AND SEMICONDUCTOR CHIP

(71) Applicant: OSRAM Opto Semiconductors GmbH, Regensburg (DE)

(72) Inventor: Lutz Höppel, Alteglofsheim (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/488,571

(22) PCT Filed: Mar. 6, 2018

(86) PCT No.: PCT/EP2018/055448
§ 371 (c)(1),
(2) Date: Aug. 23, 2019

(87) PCT Pub. No.: WO2018/162464
PCT Pub. Date: Sep. 13, 2018

(65) Prior Publication Data
US 2020/0035855 A1      Jan. 30, 2020

(30) Foreign Application Priority Data

Mar. 7, 2017    (DE) ...................... 10 2017 104 752.2

(51) Int. Cl.
*H01L 21/46* (2006.01)
*H01L 23/58* (2006.01)
(Continued)

(52) U.S. Cl.
CPC ...... *H01L 33/0095* (2013.01); *H01L 33/0093* (2020.05); *H01L 33/56* (2013.01);
(Continued)

(58) Field of Classification Search
CPC ................................................. H01L 33/0093
(Continued)

(56) References Cited

U.S. PATENT DOCUMENTS 9,530,930 B2    12/2016  Liu et al.
10,236,419 B2 *  3/2019  Hoeppel ................. H01L 33/60
(Continued)

FOREIGN PATENT DOCUMENTS

DE       102015114587 A1    3/2017

*Primary Examiner* — Calvin Lee
(74) *Attorney, Agent, or Firm* — Slater Matsil, LLP (57) ABSTRACT

A method for transferring semiconductor bodies and a semiconductor chip are disclosed. In an embodiment a method includes providing a semiconductor structure on a growth substrate, arranging a cover layer on a side of the semiconductor structure facing away from the growth substrate, wherein the cover layer is mechanically fixedly connected to the semiconductor structure, arranging a transfer structure on a side of the cover layer facing away from the semiconductor structure, wherein the transfer structure is mechanically fixedly connected to the cover layer via at least one contact structure, wherein a sacrificial layer is arranged between the cover layer and the transfer structure, and wherein the sacrificial layer does not cover any of the at least one contact structure, removing the growth substrate from the semiconductor structure, subdividing the semiconductor structure into a plurality of semiconductor bodies, arranging a carrier on a side of the semiconductor body facing away from the transfer structure, selectively removing the sacrificial layer and removing the transfer structure from the semiconductor bodies.

9 Claims, 5 Drawing Sheets

(51) Int. Cl.
  *H01L 33/00* (2010.01)
  *H01L 33/56* (2010.01)
  *H01L 33/62* (2010.01)

(52) U.S. Cl.
  CPC ........ *H01L 33/62* (2013.01); *H01L 2933/005* (2013.01); *H01L 2933/0033* (2013.01)

(58) Field of Classification Search
  USPC ................. 257/635; 438/107–110, 455–465
  See application file for complete search history.

(56) References Cited

U.S. PATENT DOCUMENTS

| | | | |
|---|---|---|---|
| 10,418,535 B2 * | 9/2019 | Perzlmaier | H01L 33/46 |
| 10,468,395 B2 * | 11/2019 | Rafael | H01L 33/486 |
| 10,784,408 B2 * | 9/2020 | Hoppel | H01L 33/44 |
| 2003/0189212 A1 | 10/2003 | Yoo | |
| 2006/0105542 A1 | 5/2006 | Yoo | |
| 2013/0126081 A1 | 5/2013 | Hu et al. | |
| 2013/0285086 A1 | 10/2013 | Hu et al. | |
| 2018/0254386 A1 * | 9/2018 | Perzlmaier | H01L 33/62 |
| 2020/0058840 A1 * | 2/2020 | Tangring | H01L 33/62 |

\* cited by examiner

METHOD FOR TRANSFERRING SEMICONDUCTOR BODIES AND SEMICONDUCTOR CHIP

This patent application is a national phase filing under section 371 of PCT/EP2018/055448, filed Mar. 6, 2018, which claims the priority of German patent application 102017104752.2, filed Mar. 7, 2017, each of which is incorporated herein by reference in its entirety.

TECHNICAL FIELD

A method for transferring semiconductor bodies is specified. In addition, a semiconductor chip is specified.

SUMMARY OF THE INVENTION

Embodiments provide a method for transferring semiconductor bodies, which can be carried out in a particularly time-saving and space-saving manner. Further embodiments provide a semiconductor chip, which is particularly time-saving and space-saving to produce.

The semiconductor bodies are, for example, layer stacks which comprise at least a first, a second and a third semiconductor layer. For example, the second semiconductor layer is arranged in a vertical direction, which runs perpendicular to the main extension plane of the semiconductor body, between the first and the third semiconductor layer. In particular, the second semiconductor layer is configured to generate electromagnetic radiation during normal operation. In particular, the first, second and third semiconductor layers are deposited on one another by means of an epitaxial process. The semiconductor layers extend, for example, parallel to the main extension plane of the semiconductor body and are arranged one above the other in a stacking direction perpendicular thereto.

According to at least one embodiment of the method for transferring semiconductor bodies, a semiconductor structure is provided on a growth substrate in a method step A). The semiconductor structure comprises, for example, a plurality of the semiconductor layers, which are deposited on one another in an epitaxial process. For example, the semiconductor structure comprises the first, second and third semiconductor layers, with which the semiconductor bodies are formed. In particular, the first semiconductor layer forms a p-type region, the third semiconductor layer forms an n-type region and the second semiconductor layer forms an active region. The active region may be configured to generate electromagnetic radiation during normal operation.

In particular, the semiconductor structure is produced on the growth substrate by means of an epitaxial process. The growth substrate is formed, for example, with sapphire. In particular, the semiconductor structure and the growth substrate are cohesively and mechanically fixed bonded to each other in a manner.

According to at least one embodiment of the method for transferring semiconductor bodies, in a method step B), a cover layer is arranged on a side of the semiconductor structure facing away from the growth substrate, wherein the cover layer is mechanically fixedly connected to the semiconductor structure. In particular, the cover layer is mechanically firmly connected to the semiconductor structure via a cohesive connection, so that the cover layer can be detached from the semiconductor structure only by destroying the semiconductor structure and/or the cover layer. The cover layer is formed, for example, with an inorganic dielectric, in particular with silicon oxide ($SiO_2$) and/or aluminum oxide ($Al_2O_3$). In particular, the cover layer may be formed with a material which is permeable, in particular transparent, to electromagnetic radiation generated in the semiconductor bodies. The cover layer is deposited, for example, by means of chemical vapor deposition on the semiconductor structure. In particular, the cover layer completely covers the semiconductor structure.

According to at least one embodiment of the method for transferring semiconductor bodies, in a method step C) a transfer structure is arranged on a side of the cover layer facing away from the semiconductor structure, wherein the transfer structure is mechanically fixedly connected to the cover layer via at least one contact structure. In other words, the contact structure is a mechanical contact structure, which in particular can be electrically insulated from the semiconductor material of the semiconductor structure.

The transfer structure comprises, for example, a transfer carrier and a transfer layer. In particular, the transfer carrier is arranged on the side of the transfer structure facing away from the semiconductor structure. The transfer layer has, for example, a structured surface on the side facing the semiconductor body. For example, the transfer structure and the cover layer are not in direct mechanical contact with each other but are interconnected exclusively by means of the contact structure. In particular, the contact structure is arranged between the transfer layer and the cover layer. For example, the contact structure is in direct contact with the transfer structure, in particular the transfer layer, and with the cover layer.

The transfer structure and the cover layer can be mechanically connected to one another by means of a multiplicity of contact structures. The contact structures can be arranged, for example, in a plan view, perpendicular to a lateral plane, spaced apart from one another. The lateral plane runs parallel to the main extension plane of the cover layer and/or the transfer structure. In particular, the contact structures in the lateral plane are not formed contiguous.

For example, the at least one contact structure may be formed with a material different from the cover layer and/or the transfer layer. In particular, the material of the contact structure may be selectively applied to the cover layer and/or the transfer layer. Alternatively, the at least one contact structure may be an area in which the surface of the cover layer facing away from the semiconductor structure and/or the surface of the transfer structure facing the semiconductor structure are structured or otherwise conditioned. In particular, the contact structure does not completely cover the cover layer and/or the transfer structure. By way of example, the contact structure covers at most 10 percent, in particular at most 5 percent, of the surface of the cover layer facing the transfer structure and/or of the surface of the transfer structure facing the semiconductor structure.

According to at least one embodiment of the method for transferring semiconductor bodies, in a method step D) the growth substrate is removed from the semiconductor structure. For example, the growth substrate is removed from the semiconductor structure by means of a laser lift-off process. In particular, the side of the semiconductor structure facing away from the transfer structure is free after the removal of the growth substrate.

According to at least one embodiment of the method for transferring semiconductor bodies, in a method step E) the semiconductor structure is subdivided into a multiplicity of semiconductor bodies. The semiconductor structure can be removed in regions, so that the semiconductor structure is divided into a plurality of semiconductor bodies. The semiconductor structure is not contiguous after the subdivision in the semiconductor body. In particular, each semiconductor body is arranged to be overlapping perpendicular to its main extension direction with at least one contact structure, in particular with exactly one contact structure.

For example, the semiconductor structure is subdivided by means of an etching process into a plurality of semiconductor bodies. Alternatively, the semiconductor structure is divided into a plurality of semiconductor bodies by means of a sawing process or by means of laser cutting. In particular, when subdividing the semiconductor structure, all the semiconductor layers of the semiconductor structure are completely cut transversely, for example, perpendicular to their main extension direction.

On a side of the semiconductor structure facing the cover layer, a first electrode and a first contact pad may be arranged. During normal operation, the semiconductor bodies are each electrically conductively contacted and operated via at least one first electrode and a first contact pad. For example, a plurality of first electrodes and first contact pads may be arranged between the cover layer and the semiconductor structure on the semiconductor structure. In particular, each semiconductor body which is formed from the semiconductor structure, at least one first electrode and at least one first contact pad is assigned.

After dividing the semiconductor structure into a plurality of semiconductor bodies, a passivation layer can be arranged on exposed surfaces of the semiconductor body. For example, the passivation layer is formed with the same material as the cover layer. In particular, the passivation layer is formed with a material which is permeable to electromagnetic radiation generated in the semiconductor body, in particular transparent. Alternatively, the passivation layer is formed with a reflective material for the electromagnetic radiation generated in the semiconductor body.

In a further method step, for example, the passivation layer is partially removed, so that the first contact pad is freely accessible. Thus, the semiconductor body can be electrically contacted and supplied with current from the outside.

In a further method step, a second contact structure and a second contact pad can be arranged on the side of the semiconductor body facing away from the cover layer, via which the semiconductor body can be electrically conductively contacted and supplied with current. In particular, at least the first electrode and the first contact pad or the second electrode and the second contact pad are transparent for electromagnetic radiation generated in the semiconductor body are transparent.

Alternatively, the second contact structure and the second contact pad can be arranged on the side of the semiconductor body facing away from the growth substrate prior to method step B). In particular, the second contact structure completely penetrates the second and the third semiconductor layer or the second and the first semiconductor layer transversely to its main extension plane. By way of example, the first and the second contact pads are arranged on the same side of the semiconductor body. In this case, the first contact pad, the second contact pad, the first electrode and the second electrode may be formed with a non-transparent material.

According to at least one embodiment of the method for transferring semiconductor bodies, in a method step F) a carrier is arranged on a side of the semiconductor body facing away from the transfer structure. For example, the carrier is mechanically fixedly connected to the semiconductor bodies. In particular, the carrier is mechanically fixedly connected to the semiconductor body by means of an adhesive and/or sintering process. Alternatively, the semiconductor bodies and the carrier are connected to one another by means of van der Waals forces, in particular temporarily. For example, the carrier is mechanically connected to the second contact pad. The carrier is formed, for example, with an electrically insulating material.

According to at least one embodiment of the method for transferring semiconductor bodies, in a method step G), the transfer structure is removed from the semiconductor bodies, wherein the mechanical connection between the transfer structure and the cover layer in the region of the contact structure is dissolved. By way of example, the semiconductor bodies are lifted off the transfer structure by means of the carrier perpendicular to the main extension plane of the semiconductor bodies. In this case, the mechanical connection between the transfer structure and the cover layer dissolves exclusively in the area of the contact structure. In particular, the contact structure is at least partially destroyed when removing the transfer structure from the semiconductor bodies. The contact structure can therefore form a predetermined breaking point which is detached from the semiconductor bodies when the transfer structure is removed. In particular, neither the cover layer nor the transfer structure is damaged in method step G).

According to at least one embodiment of the method for transferring semiconductor bodies, in the method is A) a semiconductor structure provided on a growth substrate, B) a cover layer arranged on a side facing away from the growth substrate of the semiconductor structure, wherein the cover layer is mechanically fixedly connected to the semiconductor structure, C) a transfer structure arranged on a side of the cover layer facing away from the semiconductor structure, wherein the transfer structure is mechanically fixedly connected to the cover layer via at least one contact structure, D) the growth substrate removed from the semiconductor structure, E) the semiconductor structure subdivided into a plurality of semiconductor bodies, F) a carrier arranged on a side of the semiconductor body facing away from the transfer structure, G) the transfer structure removed from the semiconductor bodies, wherein the mechanical connection between the transfer structure and the cover layer in the region of the contact structure is dissolved.

A method described here for transferring semiconductor bodies may be based, inter alia, on the following considerations. In order to transfer a multiplicity of semiconductor bodies from their growth substrate to a carrier, they can be removed from the growth substrate by means of a transfer structure and subsequently applied to the carrier. The mechanical connection between the semiconductor bodies and the transfer structure should be solvable under a given force. For this purpose, the transfer structure comprises, for example, a structure by means of which the semiconductor bodies are mechanically connected, for example, directly to the transfer structure. In order to release the transfer structure from the semiconductor body with a given force, the structure has a special geometry with a predetermined breaking point, which is destroyed when the transfer structure and the semiconductor bodies are separated. For this purpose, the structure can be shaped in the form of a long bar, which projects laterally beyond the semiconductor body. Over the length and cross-sectional area of the bar, the force under which breaks the transfer structure breaks can be defined. Alternatively, the transfer structure is connected to the semiconductor bodies by means of an inorganic sacrificial layer, so that the mechanical connection between the transfer structure and the semiconductor bodies is weakened by means of selective removal of the inorganic sacrificial layer. In particular, the sacrificial layer is formed with a material which can be structured selectively in comparison to the contact structure. For example, the sacrificial layer is formed with a dielectric, in particular silicon oxide. The dielectric of the contact structure is produced, for example, by means of a spin-on process.

The method described here for transferring semiconductor bodies may make use, inter alia, of the idea of arranging a cover layer on the semiconductor bodies, which is connected to the transfer structure via at least one contact structure. In particular, the transfer structure and the cover layer are not in direct mechanical contact. The contact structure allows a mechanical connection between the transfer structure and the cover layer, which is dissolved with a given force. In particular, the use of the contact structure does not require any special geometry of the transfer structure to create a predetermined breaking point between the cover layer and the transfer structure.

Advantageously, the contact structure can be realized in a particularly space-saving manner so that no contact structure projects beyond the semiconductor body assigned to the respective contact structure in a lateral direction. Furthermore, the force of the mechanical connection between the semiconductor body and the transfer structure can be adjusted by means of the contact structure, so that it can be adapted as a function of the mechanical connection between the semiconductor body and the carrier. Thus, the holding force of the contact structure can be adapted to the mechanical connection between the semiconductor body and the carrier without changing the geometry of the transfer structure.

According to at least one embodiment of the method for transferring semiconductor bodies, the at least one contact structure is in each case arranged on an anchor structure, wherein the anchor structure does not project beyond a semiconductor body in a lateral direction. For example, the anchor structure is partially formed of the material of the transfer layer. Alternatively, the anchor structure is partially formed of the material of the cover layer. In particular, the anchor structure is an elevation which is arranged on the cover layer and/or transfer layer. For example, each contact structure is associated with exactly one anchor structure.

In particular, the contact structures are congruent with the anchor structures in plan view on the lateral plane. By way of example, the anchor structures are a multiplicity of columnar elevations which are arranged on the side of the cover layer facing away from the semiconductor body and/or the side of the transfer layer facing the semiconductor body. In particular, the anchor structure is not destroyed when removing the transfer structure from the semiconductor bodies. Advantageously, the anchor structures associated with a semiconductor body are arranged completely overlapping in the vertical direction with the semiconductor body. Thus, no additional distance between individual semiconductor bodies is required to arrange the semiconductor bodies on the anchor structures.

According to at least one embodiment of the method for transferring semiconductor bodies, in a method step B1), which is carried out before method step C), a sacrificial layer is arranged between the cover layer and the transfer structure, wherein the sacrificial layer does not cover any of the at least one contact structure. By way of example, the sacrificial layer is formed with a photoresist which is structured, for example, by means of a lithographic method. In particular, the thickness of the sacrificial layer perpendicular to its main extension plane corresponds to the cumulated thicknesses of the anchor structure and that of the contact structure perpendicular to the main extension plane of the semiconductor body. In particular, the lateral extent of the contact structure and/or the anchor structure is predetermined by means of lithographically produced openings in the sacrificial layer. For example, the sacrificial layer is deposited and structured prior to forming the anchor structure. The sacrificial layer is mechanically firmly connected to the cover layer and/or the transfer layer. Advantageously, the mechanical stability of the connection between cover layer and transfer structure is increased by means of the sacrificial layer. In particular, the sacrificial layer is not formed from the same material as the cover layer, the transfer structure and/or the contact structure.

According to at least one embodiment of the method for transferring semiconductor bodies, in a method step F1), which is carried out before method step G), the sacrificial layer is selectively removed. In particular, the sacrificial layer is selectively removed by means of etching and/or a solvent. After removal of the sacrificial layer, the transfer structure and the cover layer are mechanically connected to one another exclusively via the contact structure. Advantageously, the mechanical connection between the cover layer and the transfer structure can be adjusted by removing the sacrificial layer at a predetermined time to a connection strength predetermined by the contact structure.

According to at least one embodiment of the method for transferring semiconductor bodies, in step G) the transfer structure is lifted off the semiconductor bodies in a direction perpendicular to the main extension plane of the transfer structure, wherein the mechanical connection in the area of the contact structure is released when lifting off. For example, the main extension plane of the transfer structure runs perpendicular to the stacking direction of the semiconductor layers of the semiconductor body. In particular, the force with which the transfer structure is detached from the semiconductor bodies has no direction component which acts as a shearing force parallel to the main extension direction of the semiconductor body and/or the transfer structure.

When releasing the mechanical connection, for example, the contact structure can be destroyed. In particular, the connection of the contact structure is dissolved at an interface to the cover layer and/or transfer structure, in particular transfer layer. Advantageously, the mechanical connections between the transfer structure and the semiconductor bodies can be selectively achieved exclusively by means of a targeted application of force.

According at least one embodiment of the method for transferring semiconductor bodies, the contact structure is formed with an inorganic material. By way of example, the contact structure is formed with an inorganic dielectric, for example, silicon oxide or aluminum oxide. In particular, the contact structure may be formed with the same material as the cover layer and/or the transfer structure. Advantageously, the contact structure may be adapted to dissipate heat generated in the semiconductor body during normal operation.

According to at least one embodiment of the method for transferring semiconductor bodies, the surface of the contact structure, which is exposed to the outside before step C), is selectively conditioned. In particular, the entire exposed surface of the contact structure is selectively conditioned. For example, the surface is selectively roughened or smoothed to have a predetermined roughness. In particular, the surface may be treated by means of a plasma, a gas or ions. For example, the wetting properties of the surface can be adjusted by means of the conditioning. For example, the surface may be conditioned by means of an atomic monolayer of a material different from the cover layer and/or carrier layer. In particular, the sacrificial layer serves as a mask to condition predetermined regions of the surface. Advantageously, by means of the conditioning, the force, under which the mechanical connection between the contact structure and the cover layer and/or transfer structure dissolves, can be predetermined. In particular, a predetermined breaking point is generated in the region of the surface which forms the region of the weakest connection between semiconductor body and transfer structure under a tensile load running perpendicular to the lateral plane.

According at least one embodiment of the method for transferring semiconductor bodies, the surface of the contact structure, which is exposed to the outside before step C), is conditioned with a bonding agent. For example, the agent comprises titanium, chromium, nickel, platinum, hydrocarbon or fluoropolymer, especially hexamethyldisilazane (HMDS). In particular, the contact structure and the cover layer and/or transfer layer are connected to one another exclusively via the material of the bonding agent. Advantageously, the mechanical bonding force of the contact structure to the cover layer and/or transfer layer can be adapted with the bonding agent, so that the mechanical connection between the semiconductor body and the transfer structure in the region of the bonding agent is released under a predetermined force.

According to at least one embodiment of the method for transferring semiconductor bodies, the surface of the contact structure, which is exposed to the outside before step C), is conditioned with a monolayer of a material which is different from the cover layer and/or transfer structure. For example, the adhesion of the transfer structure and/or the cover layer to the contact structure is adjusted by means of the material. In particular, a van der Waals bond between the contact structure and the cover layer and/or transfer structure is produced by means of the material. Advantageously, the monolayer of the material allows a targeted adjustment of the mechanical bonding force between the contact structure and the cover layer and/or the transfer structure.

According to at least one embodiment of the method for transferring semiconductor bodies, the surface of the contact structure, which is exposed to the outside before step C), is conditioned by means of a plasma. For example, the wetting properties of the surface are adapted by means of the plasma, so that the mechanical connection of the material arranged on the surface of the cover layer and/or the transfer structure is set. In particular, the force of the mechanical connection between the semiconductor bodies and the transfer structure is sufficiently strong, so that the semiconductor bodies can be lifted by means of the transfer structure. In particular, the holding force of the connection between the semiconductor bodies and the transfer structure is greater than the weight force of the semiconductor bodies. Furthermore, the force of the mechanical connection between the semiconductor bodies and the transfer structure is less than the force of the mechanical connection between the semiconductor bodies and the carrier. Advantageously, by adjusting the wetting properties of the surface of the contact structure, it can be defined how large the portion of the surface which contributes to the mechanical connection between the contact structure and the cover layer and/or the transfer structure.

According to at least one embodiment of the method for transferring semiconductor bodies, each semiconductor body is arranged to overlap in the vertical direction with a multiplicity of contact structures. For example, each semiconductor body is arranged to overlap in the vertical direction body with at least two, in particular at least four, contact structures. In particular, no contact structure projects beyond the semiconductor body which this contact structure mechanically connects to the transfer structure in the lateral direction. Advantageously, the holding force of the mechanical connection between the transfer structure and the semiconductor body can be adjusted via the number of contact structures which mechanically connect the semiconductor bodies to the transfer structure.

Furthermore, a semiconductor chip is specified. The semiconductor chip can in particular be produced by the method described here. That is, all features disclosed for the method are also disclosed for the semiconductor chip and vice versa.

By way of example, the semiconductor chip is an optoelectronic semiconductor chip which is set up to emit electromagnetic radiation during normal operation. In particular, the semiconductor chip can be supplied with current via a first electrode and a second electrode and can be electrically conductively contacted via a first contact pad and a second contact pad.

According to at least one embodiment, the semiconductor chip comprises a semiconductor body and a cover layer. For example, the semiconductor body is formed with a multiplicity of semiconductor layers. In particular, the semiconductor layers are epitaxially deposited on each other. For example, the cover layer completely covers a main surface of the semiconductor body. In particular, the cover layer is formed by a chemical vapor deposition (abbreviated CVD) method. For example, the cover layer is formed with an inorganic dielectric, in particular silicon oxide and/or aluminum oxide.

In particular, the semiconductor body comprises a semiconductor layer having an active region, in which electromagnetic radiation is generated during normal operation of the semiconductor chip. In particular, the electromagnetic radiation has a wavelength in the wavelength range between infrared and UV radiation on. In particular, a first electrode and a first contact pad can be arranged between the cover layer and the semiconductor body. The first contact pad has at least one region which is exposed to the outside, so that the semiconductor chip can be electrically contacted from the outside via the first contact pad and can be supplied switch current via the first electrode during normal operation by means of the contact pad.

According to at least one embodiment of the semiconductor chip, the cover layer is formed with an inorganic dielectric. For example, the cover layer is formed with silicon oxide and/or aluminum oxide. In particular, the cover layer is formed with a material which is permeable, in particular transparent, to the electromagnetic radiation generated in the semiconductor chip.

According to at least one embodiment of the semiconductor chip, at least one contact structure is arranged on the side of the cover layer facing away from the semiconductor body, wherein the contact structure consists of an inorganic material. For example, the contact structure consists of $SiO_2$, or $Al_2O_3$. In particular, the contact structure consists exclusively of the inorganic material. In particular, the contact structure on the side facing away from the cover layer on a surface which is not smooth and/or not parallel to the main extension plane of the cover layer and/or has residues of a bonding agent. In particular, the contact structure is structured by means of an etching process.

According to at least one embodiment of the semiconductor chip, the at least one contact structure is arranged on an anchor structure, the anchor structure is formed with the same material as the cover layer, and does not terminate the surface of the contact structure facing away from the semiconductor body flush with the side of the cover layer facing away from the semiconductor body. The anchor structure is, for example, an elevation on the side of the cover layer facing away from the semiconductor body. In particular, the anchor structure is formed with the material of the cover layer. The anchor structure has, for example, the same lateral extent as the contact structure, which is arranged on the anchor structure. The semiconductor chip may have a plurality of anchor structures and contact structures. In particular, each anchor structure is associated with exactly one contact structure. For example, all anchor structures have a same height perpendicular to the main extension plane of the cover layer.

According to at least one embodiment of the semiconductor chip, the semiconductor body has a thickness of at most 10 μm perpendicular to its main extension direction. The semiconductor body preferably has a thickness of at most 5 μm perpendicular to its main extension direction. Advantageously, the semiconductor chip is an optoelectronic semiconductor chip with a particularly small thickness, which has a particularly small required space.

In accordance with at least one embodiment of the semiconductor chip, the semiconductor body has no surfaces exposed to the outside. For example, all surfaces of the semiconductor body which are not covered by the cover layer are covered by a protective layer. In particular, the protective layer is formed with the same material as the cover layer. By way of example, the semiconductor chip has a second electrode and a second contact pad on the side facing away from the cover layer. In particular, the semiconductor chip is contacted electrically conductive in normal operation via the first and the second contact pad and supplied with current in normal operation via the first and second electrodes. Advantageously, the semiconductor body is particularly well protected from environmental influences by means of the protective layer and the cover layer, so that the semiconductor chip is particularly robust.

According to at least one embodiment, the semiconductor chip has a first and a second contact pad, which are arranged on a common side of the semiconductor body. For example, a majority of the electromagnetic radiation generated during normal operation emerges through the side facing away from the first and second contact pad. In particular, the first and second contact pads and the contact structure are arranged on the same side of the semiconductor body. For example, the semiconductor body and/or the protective layer have a roughened surface on the side applied to the contact pads. Advantageously, electromagnetic radiation generated during normal operation exits through one side of the semiconductor body, on which neither contact pads nor contact structure are arranged.

BRIEF DESCRIPTION OF THE DRAWINGS

Further advantages and advantageous refinements and developments of the method for transferring semiconductor bodies and of the semiconductor chip will become apparent from the following exemplary embodiments illustrated in conjunction with the figures.

FIGS. 1 to 10A show the method steps of a method for transferring semiconductor bodies according to a first exemplary embodiment.

In the exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

DETAILED DESCRIPTION OF ILLUSTRATIVE EMBODIMENTS

Figure 1:
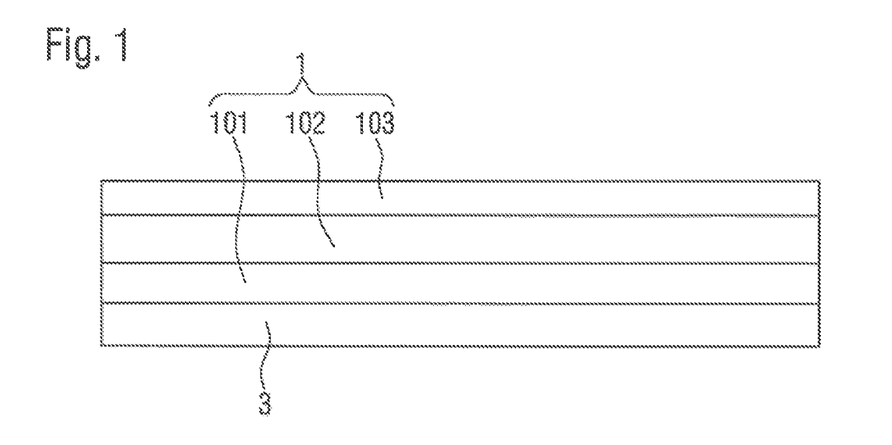

FIG. 1 shows a schematic sectional view of a semiconductor structure 1 and a growth substrate 3, which are provided in a method step A of the method described here. The semiconductor structure 1 comprises a first 101, a second 102 and a third 103 semiconductor layer. By way of example, the first semiconductor layer 101 is an n-type semiconductor layer which is formed, for example, with gallium nitride and which, for example, has a thickness of 6 μm. The second semiconductor layer 102 comprises, for example, an active region in which electromagnetic radiation is generated during normal operation. For example, the active region comprises a plurality of quantum well structures. The third semiconductor layer 103 is formed, for example, with a p-type semiconductor material, in particular gallium nitride. By way of example, the third semiconductor layer 103 has a thickness of 130 nm. The growth substrate 3, the first semiconductor layer 101, the second semiconductor layer 102, and the third semiconductor layer 103 are cohesively bonded to each other in a mechanically bonded manner. In particular, the first 101, the second 102 and the third 103 semiconductor layer of the semiconductor structure 1 have been produced in an epitaxial process on the growth substrate.

Figure 2:
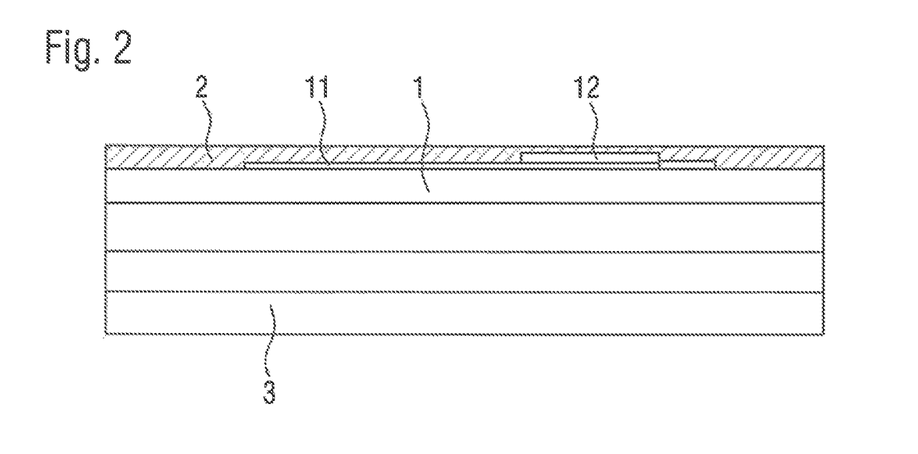

FIG. 2 shows the sectional view of the semiconductor structure from FIG. 1 after a cover layer 2 has been arranged on a side of the semiconductor structure 1 facing away from the growth substrate 3 in a method step B), wherein the cover layer 2 being mechanically cohesively bonded to the semiconductor structure 1. Between the cover layer 2 and the semiconductor structure 1, a first electrode 11 and a first contact pad 12 are arranged on the side of the semiconductor structure 1 facing away from the growth substrate 3. The first electrode 11 is in direct contact with the third layer 103 of the semiconductor structure 1. For example, the first electrode 11 and the first contact pad 12 are formed with an electrically conductive material, in particular a metal.

The cover layer 2 may be formed with an inorganic dielectric. In particular, the cover layer 2 is formed with silicon oxide and/or aluminum oxide. By way of example, the cover layer 2 is deposited on the semiconductor structure 1 by means of a chemical vapor deposition process. In particular, the side of the cover layer 2 facing away from the semiconductor structure 1 is a plane surface which has no elevations.

Figure 3:
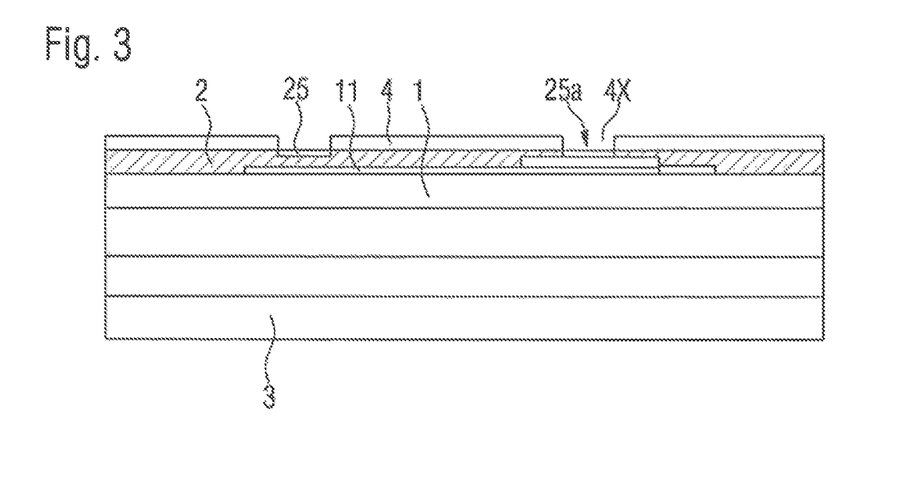

FIG. 3 shows the semiconductor structure of FIG. 2 after performing a method step B1) for transferring semiconductor bodies. In this method step, a sacrificial layer 4 was arranged on the side of the cover layer 2 facing away from the semiconductor structure 1. The sacrificial layer 4 has openings 4X, which completely penetrate the sacrificial layer 4 in the vertical direction, perpendicular to the main extension plane of the semiconductor structure 1. By way of example, the sacrificial layer 4 is formed with a semiconductor material, in particular with germanium or silicon. The sacrificial layer 4 can be structured by means of lithographic methods. In the openings, a contact structure 25 is arranged in each case. The contact structure 25 is in direct mechanical contact with the cover layer 2. In particular, the contact structure 25 directly adjoins the sacrificial layer 4 and the cover layer 2. The lateral extent of the contact structure 25 is limited by the sacrificial layer 4.

The contact structure 25 is formed of an inorganic material. For example, the contact structure 25 is formed with aluminum oxide or silicon oxide. In particular, the contact structure is deposited on the cover layer 2 by means of a chemical vapor deposition method or by sputtering. The contact structure 25 has an outwardly exposed surface 25*a*, which may be conditioned. For example, the surface 25*a* is conditioned with a bonding agent so that a thin layer of bonding agent is deposited on the surface 25*a*. The surface 25*a* may be conditioned with a monolayer of a material different from the one of the cover layer. In addition, the surface 25*a* may be conditioned by means of a plasma such that the surface 25*a* has altered wetting properties.

Figure 4:
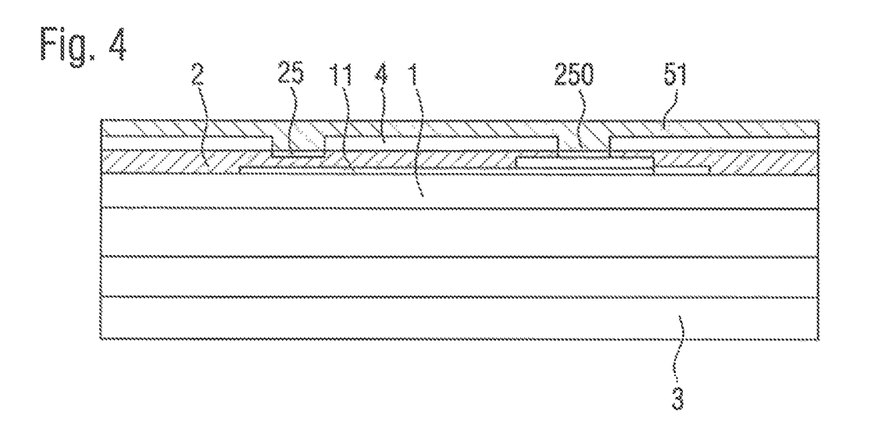

FIG. 4 shows the semiconductor structure 1 of FIG. 3 after a further method step. In this method step, a transfer layer 51 was arranged on the side of the contact structure 25 and the sacrificial layer 4 facing away from the semiconductor structure 1. The transfer layer 51 is formed with, for example, an inorganic dielectric material. In particular, the transfer layer 51 is formed with silicon oxide and/or aluminum oxide. For example, the transfer layer 51 is deposited on the sacrificial layer 4 and on the contact structure 25 by chemical vapor deposition. The transfer layer 51 is in direct mechanical contact with the contact structure 25 and the sacrificial layer 4. The transfer layer 51 may be formed on the contact structure 25 and the sacrificial layer 4. The transfer layer 51 is mechanically connected via a cohesive connection with the contact structure, in particular the sacrificial layer 4. The transfer layer 51 is in direct contact with the contact structure 25, for example, only in the region of the surface 25*a* of the contact structure 25. The transfer layer 51 has, for example, a planar surface on the side facing away from the semiconductor structure 1. In the regions of the openings 4X of the sacrificial layer 4, an anchor structure 250 is formed with the material of the transfer layer 51. The cumulative thickness of the anchor structure 250 and the contact structure 25 in the vertical direction is the same as the thickness of the sacrificial layer 4.

Figure 5:
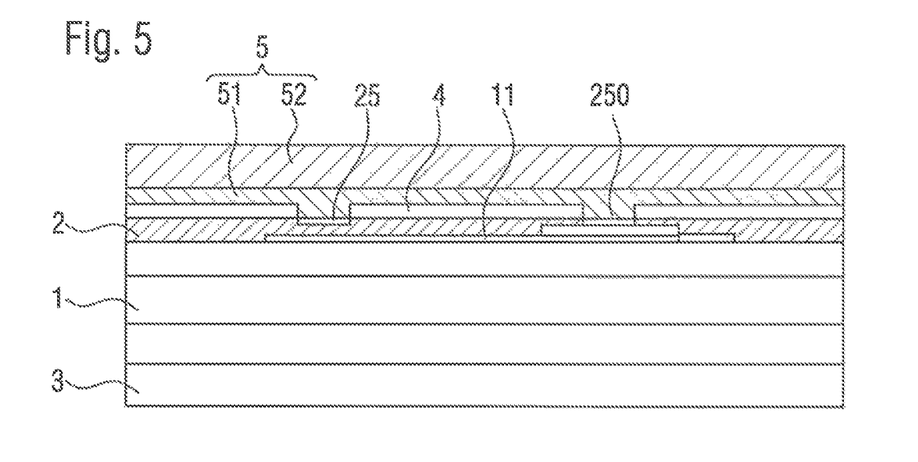

FIG. 5 shows the semiconductor structure of FIG. 4 after a method step, in particular after carrying out method step C) of the method for transferring semiconductor bodies. In the method step, a transfer carrier 52 was arranged on the side of the transfer layer 51 facing away from the semiconductor structure 1. The transfer carrier 52 and the transfer layer 51 are mechanically cohesively bonded together. For example, the transfer carrier 52 is attached to the transfer layer 51 by means of a soldering or gluing process. The transfer layer 51, the transfer carrier 52 and the mechanical connection between the transfer layer 51 and the transfer carrier 52 forms a transfer structure 5. For example, the transfer carrier 52 is a wafer whose coefficient of thermal expansion matches the thermal expansion coefficient of the semiconductor structure 1. In particular, the difference of the thermal expansion coefficients of the transfer carrier 52 and the semiconductor structure 1 is a maximum of 10 ppm/Kelvin.

In particular, the contact structure is formed with an organic material and the cover layer 2 and/or the transfer structure 5 are not formed with a metallic material. Alternatively, the contact structure 25 is formed with a metallic material and the cover layer 2 and/or the transfer structure are not formed with an organic material.

Figure 6:
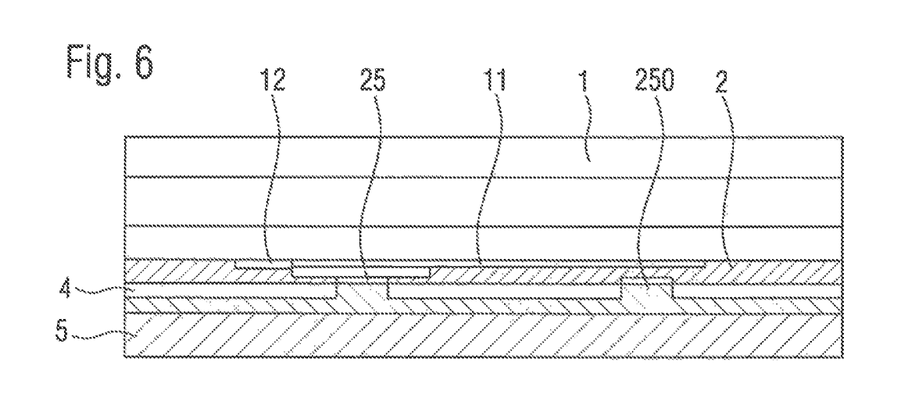

FIG. 6 shows the semiconductor structure 1 of FIG. 5 after carrying out a method step D), in which the growth substrate 3 is removed from the semiconductor structure. The growth substrate 3 is, for example, a sapphire wafer, which is removed from the semiconductor structure 1 by means of a laser lift-off method. In particular, the side of the semiconductor structure 1 facing away from the transfer structure 5 is exposed to the outside.

Figure 7:
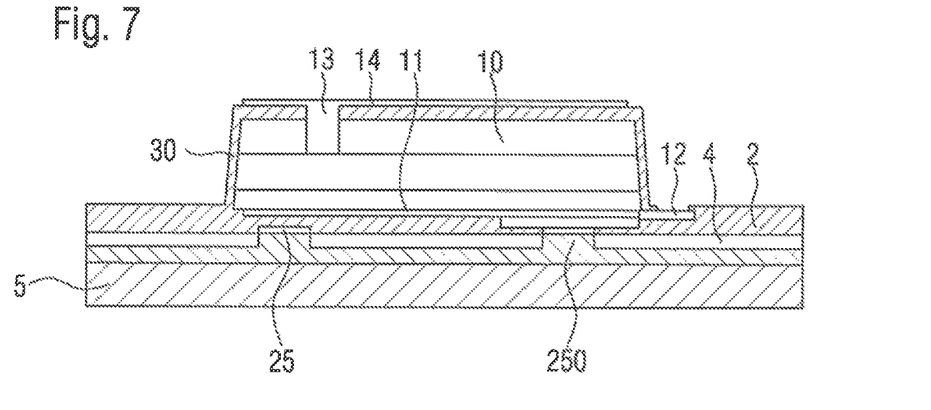

FIG. 7 shows the semiconductor structure 1 of FIG. 6 after performing a method step E) of the method for transferring semiconductor bodies 10. In method step E), the semiconductor structure 1 is subdivided into a plurality of semiconductor bodies 10. For example, the semiconductor structure 1 is subdivided into a multiplicity of semiconductor bodies 10 by means of an etching method and/or by means of a laser cutting method and/or by means of a sawing method. In particular, the semiconductor structure 1 is completely severed transversely to its main extension direction. In a further method step, the surfaces of the semiconductor body 10 which are formed during the subdivision and the surface of the semiconductor body 10 which faces away from the transfer structure 5 are covered with a protective layer 30. The protective layer 30 may be formed with the same material as the cover layer 2. For example, the protective layer 30 is formed with a transparent material, in particular with an inorganic dielectric.

In a further method step, a second electrode 13 and a second contact pad 14 are arranged on the side of the semiconductor body 10 facing away from the transfer structure 5. In particular, the first contact pad 12 and the second contact pad 14 have a surface exposed to the outside, via which the semiconductor body 10 can be electrically conductively contacted. During normal operation, the semiconductor body 10 is supplied with current via the first electrode 11 and the second electrode 13. In particular, the semiconductor body 10 has no surfaces exposed to the outside.

Figure 8:
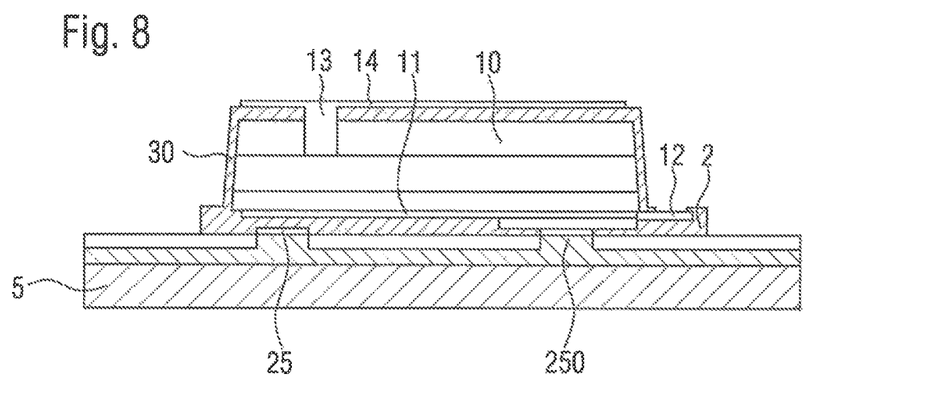

FIG. 8 shows the semiconductor body 10 of FIG. 7 after a method step in which the cover layer 2 has been partially removed. For example, the cover layer 2 was partially removed by means of an etching process. Thus, the sacrificial layer 4 is freely accessible from the outside. In particular, the cover layer 2 is removed only in areas in which the cover layer 2 is not arranged overlapping with a semiconductor body. Thus, after the partial removal of the cover layer 2, the side of the semiconductor body 10 facing the transfer structure 5 is completely covered by the cover layer 2.

Figure 9:
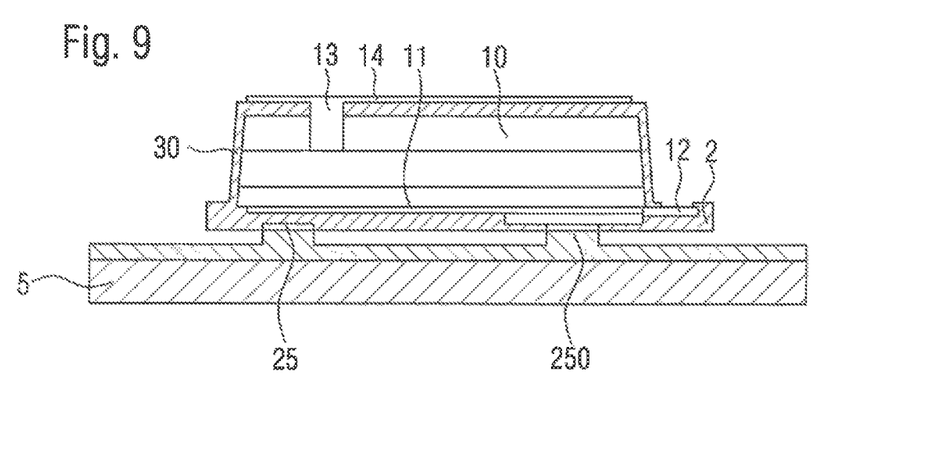

FIG. 9 shows the semiconductor body 10 after carrying out a further method step in which the sacrificial layer 4 has been completely removed. For example, the sacrificial layer 4 has been completely removed by means of a solvent or by means of an etching process. After this method step, the transfer structure 5 is connected exclusively to the cover layer 2 via the contact structures 25. In particular, the contact structure 25 forms the only contact point between the transfer structure 5 and the cover layer 2 or the semiconductor body 10. In particular, the surface 25*a* of the contact layer 25 is conditioned such that it forms the weakest mechanical connection between the transfer structure 5 and the semiconductor body 10. In other words, the contact structure 25 is formed as a predetermined breaking point. The anchor structure 250 is not formed as a predetermined breaking point.

Figure 10A:
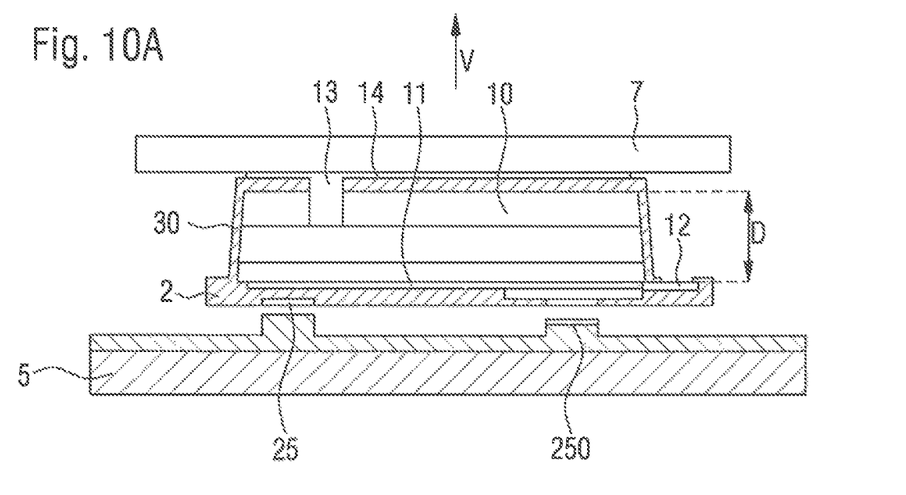
FIGS. 10A, 10B and 10C are sectional views of a semiconductor chip according to first and second embodiments.

FIG. 10A shows the semiconductor body 10 after carrying out a method step F) and a method step G) for transferring semiconductor bodies. In method step F), a carrier 7 is arranged on the side of the semiconductor body 10 facing away from the transfer structure 5. For example, the carrier 7 is cohesively bonded to the semiconductor body 10 by means of an adhesive process or by van der Waals bonding.

In particular, the carrier 7 and the second contact pad 14 are in direct mechanical contact with each other.

In method step G), the transfer structure is removed from the semiconductor bodies, wherein the connection between the transfer structure and the cover layer in the region of the contact structure 25 is dissolved. In particular, the connection is dissolved in the area of the surface 25a of the contact structure 25. Alternatively, the contact structure 25 is destroyed upon release of the mechanical connection. In particular, the anchor structure 250 is not destroyed when the mechanical connection between the semiconductor body 10 and the transfer structure 5 is released. The mechanical connection of the contact structure 25 is released by means of a tensile force S. In particular, the tensile force S is directed in a direction V, perpendicular to the main extension plane of the contact structure and/or of the semiconductor body.

FIG. 10A shows a semiconductor chip comprising a semiconductor body 10 and a cover layer 2. The cover layer 2 is formed with an inorganic dielectric and at least one contact structure 25 is arranged on the side of the cover layer 2 facing away from the semiconductor body 10, wherein the contact structure 25 consists of an inorganic dielectric. The semiconductor chip has a thickness D of at most 10 μm perpendicular to its main extension direction.

Figure 10B:
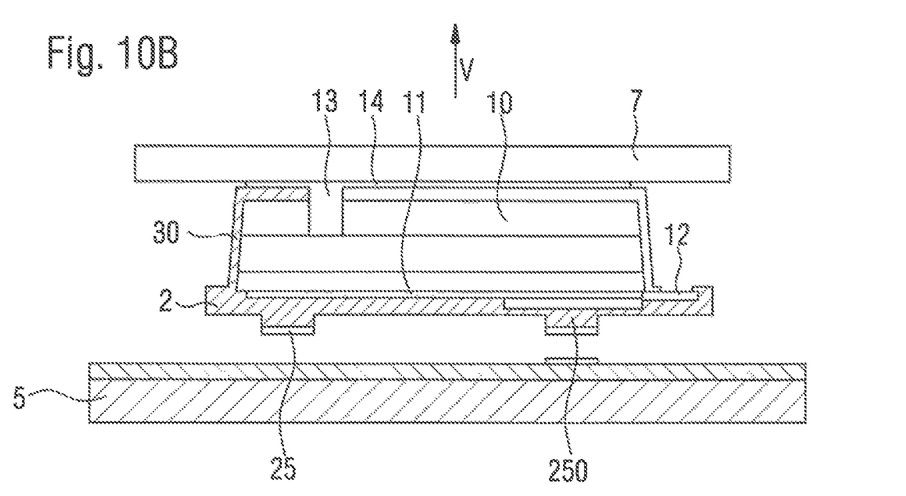

FIG. 10B shows a semiconductor chip according to a second exemplary embodiment, wherein two contact structures 25 are each arranged on an anchor structure 250, the anchor structures 250 are formed with the same material as the cover layer 2, and the surface 25a of the contact structure 25 facing away from the semiconductor body 10 is not flush with the side facing away from the semiconductor body 10 of the cover layer 2. For example, only part of the contact structure 25 originally arranged on the anchor structure 250 or the cover layer 2 can be present on the semiconductor chip. For example, when the transfer structure 5 was separated from the contact structure 25, the contact structure was partially destroyed, so that a part of the contact structure 25 remains on the surface of the transfer layer 51. In particular, the semiconductor body 10 of the semiconductor chip has no surface exposed to the outside.

In particular, the anchor structure 250 is a structure projecting beyond the surface of the cover layer 2. In the lateral direction, parallel to the main extension plane of the semiconductor body 10, the contact structure 25 and the anchor structure 250 are congruent. In particular, the semiconductor body is arranged overlapping in a vertical direction V with a plurality of contact structures. Furthermore, no contact structure 25 and/or anchor structure 250 projects beyond a semiconductor body 10 in a lateral direction, parallel to the main extension plane of the semiconductor body.

Figure 10C:
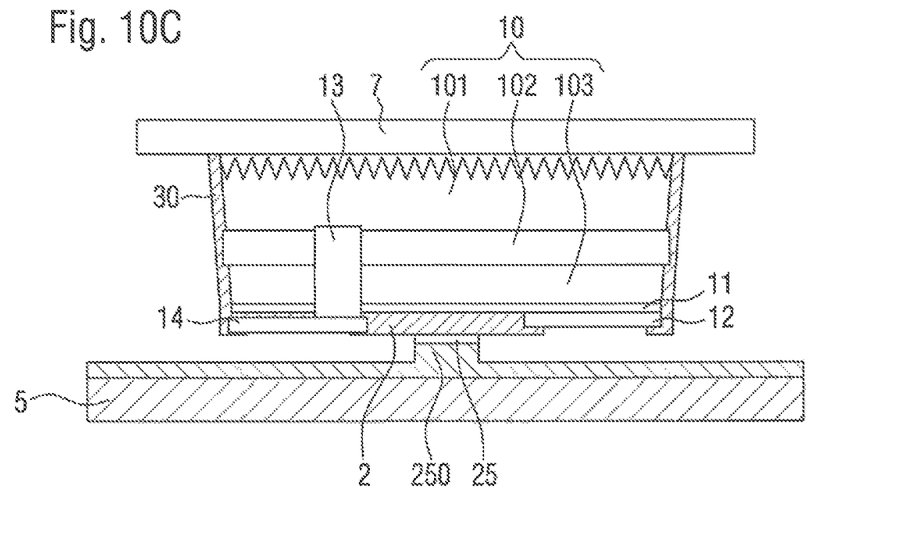

FIG. 10C shows a semiconductor chip according to a third exemplary embodiment. In contrast to the exemplary embodiments shown in FIGS. 10A and 10B, the first 12 and the second 14 contact pads and the contact structure 25 are arranged on the same side of the semiconductor body 10. The semiconductor body 10 has a via in which the second electrode 13 is arranged. The second electrode 13 completely penetrates the third semiconductor layer 103, the second semiconductor layer 102 and the first electrode 11 transversely to its main extension plane. Further, according to the third embodiment, exactly one contact structure is arranged in the vertical direction overlapping with the semiconductor body.

During normal operation, the semiconductor chip is electrically conductively contacted and supplied switch current via the first 12 and second 14 contact pads. In normal operation, electromagnetic radiation is generated in the second semiconductor layer 102 and emitted by the side facing away from the first 12 and the second contact pad 13. In particular, the side of the semiconductor chip facing away from the first 12 and second 14 contact pads has a roughened surface. By means of the roughened surface, the electromagnetic radiation generated in the semiconductor body is coupled out with improved efficiency. In the present case, the roughened surface is formed with the material of the first semiconductor layer 101. In particular, a dielectric can be arranged on the roughened surface, which complements the roughened surface in a conforming manner. Alternatively, the first semiconductor layer may be covered with a dielectric, which has a roughened surface on its side facing away from the first semiconductor layer 101. In particular, the dielectric may be formed with the same material as the protective layer 30.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. A method comprising:
providing a semiconductor structure on a growth substrate;
arranging a cover layer on a side of the semiconductor structure facing away from the growth substrate, wherein the cover layer is mechanically fixedly connected to the semiconductor structure;
arranging a transfer structure on a side of the cover layer facing away from the semiconductor structure, wherein the transfer structure is mechanically fixedly connected to the cover layer via at least one contact structure, and wherein the contact structure forms the only contact point between the transfer structure and the cover layer;
removing the growth substrate from the semiconductor structure;
subdividing the semiconductor structure into a plurality of semiconductor bodies;
arranging a carrier on a side of the semiconductor body facing away from the transfer structure; and
removing the transfer structure from the semiconductor bodies,
wherein a mechanical connection between the transfer structure and the cover layer in a region of the contact structure is dissolved, and
wherein the contact structure comprises an inorganic dielectric.

2. A method comprising:
providing a semiconductor structure on a growth substrate;
arranging a cover layer on a side of the semiconductor structure facing away from the growth substrate, wherein the cover layer is mechanically fixedly connected to the semiconductor structure;
arranging a transfer structure on a side of the cover layer facing away from the semiconductor structure, wherein the transfer structure is mechanically fixedly connected to the cover layer via at least one contact structure, wherein a sacrificial layer is arranged between the cover layer and the transfer structure, and wherein the sacrificial layer does not cover any of the at least one contact structure;

removing the growth substrate from the semiconductor structure;

subdividing the semiconductor structure into a plurality of semiconductor bodies;

arranging a carrier on a side of the semiconductor body facing away from the transfer structure;

selectively removing the sacrificial layer; and removing the transfer structure from the semiconductor bodies, wherein a mechanical connection between the transfer structure and the cover layer in a region of the contact structure is dissolved, wherein the contact structure comprises an inorganic dielectric.

3. The method according to claim 2, wherein removing the transfer structure comprises lifting off the semiconductor bodies in a direction perpendicular to a main extension plane of the transfer structure, and wherein the mechanical connection in the region of the contact structure is released when lifting off.

4. The method according to claim 2, wherein a surface of the contact structure, which is exposed to the outside before arranging the transfer structure, is conditioned with a monolayer of a material different from the cover layer and/or the transfer structure.

5. The method according claim 2, wherein the at least one contact structure is arranged in each case on an anchor structure, and wherein the anchor structure does not project beyond any semiconductor body in a lateral direction.

6. The method according to claim 2, wherein a surface of the contact structure, which is exposed to the outside before arranging the transfer structure, is conditioned with a bonding agent.

7. The method according to claim 2, wherein a surface of the contact structure, which is exposed to the outside before arranging the transfer structure, is selectively conditioned.

8. The method according to claim 2, wherein a surface of the contact structure, which is exposed to the outside before arranging the transfer structure, is conditioned by a plasma.

9. The method according to claim 2, wherein each semiconductor body is arranged to overlap in a vertical direction with a plurality of contact structures.

* * * * *